United States Patent

Sounik

Patent Number: 5,565,544
Date of Patent: Oct. 15, 1996

[54] PROCESS FOR PREPARING POLYHYDROXYSTYRENE WITH A NOVOLAK TYPE STRUCTURE

[75] Inventor: James R. Sounik, Corpus Christi, Tex.

[73] Assignee: Hoechst Celanese Corporation, Somerville, N.J.

[21] Appl. No.: 491,424

[22] Filed: Jun. 16, 1995

[51] Int. Cl.$^6$ .................................................. C08G 65/38
[52] U.S. Cl. ........................... 528/86; 528/207; 528/210; 528/214; 528/217; 528/332; 528/361; 528/363; 528/271
[58] Field of Search .................................. 521/212, 214, 521/215, 271, 125

[56] References Cited

U.S. PATENT DOCUMENTS

| | | | |
|---|---|---|---|
| Re. 34,122 | 11/1992 | Sheehan et al. | 525/241 |
| 4,032,513 | 6/1977 | Fujiwara et al. | 526/141 |
| 4,880,487 | 11/1989 | Sheehan et al. | 525/241 |
| 5,264,528 | 11/1993 | Sheehan et al. | 525/384 |
| 5,342,727 | 8/1994 | Vicari et al. | 430/157 |

*Primary Examiner*—Morton Foelak
*Attorney, Agent, or Firm*—James J. Mullen; Donald R. Cassady

[57] ABSTRACT

A process for preparing a polyhydroxystyrene having a novolak type structure which comprises the step of polymerizing a mixture of carboxylic acid and at least one substituted phenyl carbinol whose formula is:

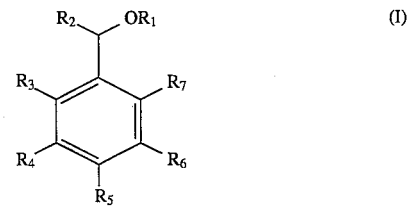

wherein (a) $R_1$ is selected from the group consisting of H, alkyl $C_1$–$C_{20}$, substituted and unsubstituted phenyl, and $C(O)R_8$ (where $R_8$ is alkyl $C_1$–$C_{20}$); (b) $R_2$ is selected from the group consisting of H and alkyl $C_1$–$C_{20}$; and (c) $R_3$–$R_7$ are each independently selected from the group consisting of H, alkyl $C_1$–$C_{20}$, $OR_9$ (where $R_9$ is H, alkyl $C_1$–$C_{20}$, esters thereof, or substituted and unsubstituted phenyl), halogen, BZT, nitro, or amino, with the proviso that at least one of $R_3$–$R_7$ is $OR_9$, in the presence of a suitable catalyst for a sufficient period of time and under suitable conditions of temperature and pressure to form said novolak type polymer.

19 Claims, No Drawings

PROCESS FOR PREPARING POLYHYDROXYSTYRENE WITH A NOVOLAK TYPE STRUCTURE

RELATED APPLICATIONS

This patent application and the following patent applications are commonly owned by the same Assignee and all relate to polyhydroxystyrene:

(a) Ser. No. 08/406,351 filed Mar. 17, 1995
(b) Ser. No. 08/406,266 filed Mar. 17, 1995
(c) Ser. No. 08/406,350 filed Mar. 17, 1995

BACKGROUND OF THE INVENTION

1. Field of the Invention

The present invention relates to a process for the production of polyhydroxystyrene (PHS) directly from a substituted phenyl carbinol ("carbinol") such as 4-hydroxymethylcarbinol (HPMC) and which PHS has a novolak type structure which has utility in the electronic chemicals market such as photoresist compositions.

2. Description of the Prior Art

In the past, one of the ways of preparing polyhydroxystyrene (PHS) was the use of 4-hydroxystyrene (HSM) as the starting material; note European Patent Application No. 0-108-624. 4-Hydroxystyrene is a well-known compound in the art.

Although there are several known ways to prepare 4-hydroxystyrene, these known methods are not commercially feasible in the further utilization of the 4-hydroxystyrene. The 4-hydroxystyrene itself is difficult to isolate since it (1) readily decomposes, and (2) is toxic via skin absorption and, as a result, those skilled in the art have made numerous attempts at finding a method of synthesizing PHS in a manner which avoids using the 4-hydroxystyrene as the starting material.

The following prior art references are disclosed in accordance with the terms of 37 CFR 1.56, 1.97, and 1.93.

U.S. Pat. No. 5,087,772 (issued Feb. 11, 1992) discloses the preparation of HSM by reacting 4-acetoxystyrene (ASM) with a suitable alcohol in the presence of a catalytic amount of a suitable base.

U.S. Pat. No. 5,340,687 discloses the alkylation of a linear polyhydroxystyrene.

European Patent Application No. 0-128-984 (publication no.) filed Aug. 30, 1983 discloses a process for the production of para-vinyl phenol (HSM) by dehydrogenation of para-ethyl phenol.

European Patent Application No. 0-108-624 (publication no.) filed Nov. 4, 1983, discloses a process for the production of p-vinyl phenol polymer (polyhydroxystyrene polymer—PHS) by polymerizing p-vinyl (HSM) in the presence of water and iron.

U.S. Pat. No. 4,032,513 (issued Jun. 28, 1977) discloses a process of producing PHS by cationically polymerizing HSM in the presence of a nitrile such as $CH_3CN$ using a cationic polymerization initiator in a homogeneous reaction system.

Other prior art references which relate to the present invention include U.S. Pat. Nos. 2,276,138; 3,547,858; 4,544,704; 4,678,843; 4,689,371; 4,822,862; 4,857,601; 4,868,256; 4,877,843; 4,898,916; 4,912,173; 4,962,147; and 4,965,400.

All of the above-cited prior art and any other references mentioned herein are incorporated herein by reference in their entirety.

SUMMARY OF THE INVENTION

A process for preparing a polyhydroxystyrene having a novolak type structure which comprises the step of polymerizing a mixture of carboxylic acid and at least one substituted phenyl carbinol whose formula is:

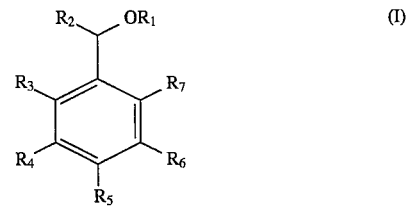

wherein (a) $R_1$ is selected from the group consisting of H, alkyl $C_1$–$C_{20}$, substituted and unsubstituted phenyl, and $C(O)R_8$ (where $R_8$ is alkyl $C_1$–$C_{20}$); (b) $R_2$ is selected from the group consisting of H and alkyl $C_1$–$C_{20}$; and (c) $R_3$–$R_7$ are each independently selected from the group consisting of H, alkyl $C_1$–$C_{20}$; $OR_9$ (where $R_9$ is H, alkyl $C_1$–$C_{20}$, esters thereof, or substituted and unsubstituted phenyl), halogen, BZT, nitro, or amino, with the proviso that at least one of $R_3$–$R_7$ is $OR_9$, in the presence of a suitable catalyst for a sufficient period of time and under suitable conditions of temperature and pressure to form said novolak type polymer, which is a unique and new PHS polymeric material having a molecular weight of from about 1,000 to about 500,000, preferably from about 1,000 to about 100,000 and more preferably from about 1,000 to about 30,000.

DETAILED DESCRIPTION OF THE INVENTION

The present invention provides a new and novel PHS and a novel process for preparing PHS having a novolak type structure which comprises the steps of (a) reacting at least one substituted phenyl carbinol with a carboxylic acid for a sufficient period of time and under suitable conditions of temperature and pressure to form a reaction mixture, and (b) polymerizing said reaction mixture in the presence of a suitable catalyst for a sufficient period of time and under suitable conditions of temperature and pressure to form a novolak type polymer.

More specifically, the present invention is directed to a unique, cost-efficient process for preparing a novolak type polymer which comprises the step of polymerizing a mixture of carboxylic acid and at least one substituted phenyl carbinol whose formula is:

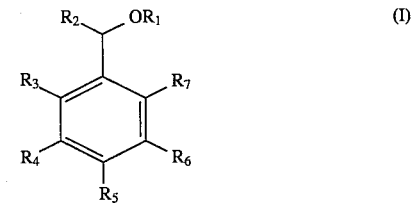

wherein (a) $R_1$ is selected from the group consisting of H, alkyl $C_1$–$C_{20}$, substituted and unsubstituted phenyl, and $C(O)R_8$ (where $R_8$ is alkyl $C_1$–$C_{20}$); (b) $R_2$ is selected from the group consisting of H and alkyl $C_1$–$C_{20}$; and (c) $R_3$–$R_7$ are each independently selected from the group consisting of H, alkyl $C_1$–$C_{20}$, $OR_9$ (where $R_9$ is H, alkyl $C_1$–$C_{20}$, esters thereof, or substituted and unsubstituted phenyl), halogen, BZT, nitro, or amino, with the proviso that at least one of $R_3$–$R_7$ is $OR_9$, in the presence of a suitable catalyst for a sufficient period of time and under suitable conditions of temperature and pressure to form said novolak type polymer.

Substituted phenyl as used herein means phenyl substituted by at least one substituent selected from the group consisting of halogen (chlorine, bromine, fluorine, or iodine), amino, nitro, hydroxy, alkyl, alkoxy which means straight or branched chain alkoxy having 1 to 10 carbon atoms, and includes, for example, methoxy, ethoxy, propoxy, isopropoxy, butoxy, isobutoxy, secondary butoxy, tertiary butoxy, pentyloxy, isopentyloxy, hexyloxy, heptryloxy, octyloxy, nonyloxy, and decyloxy, haloalkyl which means straight or branched chain alkyl having 1 to 8 carbon atoms which is substituted by at least one halogen, and includes, for example, chloromethyl, bromomethyl, fluoromethyl, iodomethyl, 2-chloroethyl, 2-bromoethyl, 2-fluoroethyl, 3-chloropropyl, 3-bromopropyl, 3-fluoropropyl, 4-chlorobutyl, 4-fluorobutyl dichloromethyl, dibromomethyl, difluoromethyl, diiodomethyl, 2,2-dichloroethyl, 2,2-dibromoethyl, 2,2-difluoroethyl, 3,3-dichloropropyl, 3,3-difluoropropyl, 4,4-dichlorobutyl, 4,4-difluorobutyl, trichloromethyl, 4,4-difluorobutyl, trichloromethyl, trifluoromethyl, 2,2,2-trifluoroethyl, 2,3,3-trifluoropropyl, 1,1,2,2-tetrafluoroethyl, and 2,2,3,3-tetrafluoropropyl.

In the above definitions and throughout the present specification, alkyl means straight or branched chain alkyl having 1 to 20 carbon atoms, and includes, for example, methyl, ethyl, propyl, isopropyl, butyl, isobutyl, secondary butyl, tertiary butyl, pentyl, isopentyl, neopentyl, hexyl, heptyl, octyl, 2-ethylhexyl, 1,1,3,3-tetramethylbutyl, nonyl, decyl, dodecyol, tetradecyl, nexadecyl, octadecyl, and eicosyl.

In conjunction with formula I and the definitions of $R_3$–$R_7$, (a) "BZT" means benzotriazole and has the structural formula:

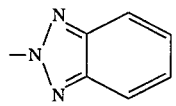

and (b) halogen means Cl, Br, I, and F.

As used herein, PHS (polyhydroxystyrene) includes a polymer, copolymer, or block polymer having at least some hydroxy groups in the structure. It is to be understood that there may be present and/or used other monomers which do not contain a hydroxy group. These include, without limitation, (a) substituted phenols:

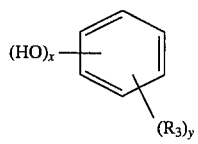

where x=0–6 and y=0–6 and $R_3$ is the same as defined herein; and (b) substituted diarylalkyls or triarylalkyls:

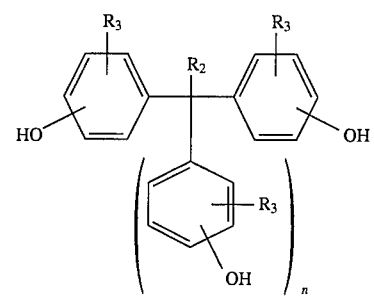

where n=0–2 and $R_2$ and $R_3$ are the same as defined herein.

Thus, PHS can be mixtures of linear, branched, and/or grafted polymers using the monomers and/or polymers set forth herein.

It has unexpectedly been found that the use of a carboxylic acid with a carbinol to form a reaction mixture and the subsequent polymerization thereof results in a new PHS having a novolak type structure. The carboxylic acid employed not only acts as a reactant, but also as a solvent. The exact theory of what causes the formation of this PHS is not exactly known. However, it is theorized that the carboxylic acid acts (or functions) in a dual capacity, i.e. as a reactant and as a solvent. The present applicant does not, however, desire to be limited by any theory. As previously mentioned, the use of a carboxylic acid is a critical feature of this invention.

The carboxylic acid employed includes, without limitation, formic, acetic, propanoic, butyric, valeric, caproic, heptanoic, octanoic, nonanoic, undecanoic, isobutyric, isovaleric, cyclohexane carboxylic acid, and mixtures thereof. It is also critical that the particular carboxylic acid be a saturated carboxylic acid, i.e. a straight chain saturated carboxylic acid, a substituted saturated carboxylic acid, and/or ring carboxylic acid. The mount of carboxylic acid used is any amount which provides a molar reaction and also acts as a solvent. Thus, at least molar equivalents of carboxylic acid and carbinol are used, and excess carboxylic acid up to twenty (and greater) times the carbinol moles.

The temperature, pressure, and time at which the carboxylic acid and carbinol are mixed together are not critical; however, it is desirable to employ the carboxylic acid in liquid form. Thus, the upper limit on temperature would desirably be the liquid/gas phase temperature of the carboxylic acid.

The catalyst employed in the present invention process is critical and is selected from the group $H_2SO_4$, HCl, $AlCl_3$, $H_3PO_4$, oxalic acid, $SnCl_2$, $BF_3$, $BBr_3$, $BCl_3$, para-toluene sulfonic acid, and methane sulfonic acid. Thus, Lewis acids and protic acids having a pKa of less than about 4.75 are suitable.

The catalyst is used in any amount in order to facilitate the reaction, i.e. polymerization, to yield the PHS which has a novolak type structure. Such amounts generally are from about one part per million (ppm) to about 100,000 ppm, or higher.

The temperature employed in the polymerization is generally less than about 120° C., more specifically from about 0° C. to about 120° C. The reaction pressure may be subatmospheric, atmospheric, or superatmospheric.

The length of time which this polymerization step is conducted is not critical and the only requirement is that the polymerization be conducted for a period of time sufficient to form PHS having a novolak type structure. Generally, this period is at least five minutes and may be as long as 25 hours.

After the polymerization of the reaction mixture (i.e. carboxylic acid+carbinol+any nucleating agent), the desired end product (PHS) is recovered from the reaction product and the residual fraction containing any unreacted carbinol can be recycled as part of the starting material for the next cycle. The end product (PHS) may be recovered from the reaction product by any method; for example, it can be separated from the fraction containing the unreacted carbinol by, e.g. precipitation in water followed by filtration, or any other suitable technique.

It is also within the scope of the present invention to utilize a nucleating agent like a seed monomer in order to prepare the reaction mixture. Such material does not have to be a carbinol failing within Formula I, nor does it have to contain any hydroxy groups. Such nucleating agents may include, without limitation, the substituted phenols and substituted triarylalkyls defined herein.

It is also within the scope of the present invention to employ a chain terminating agent after the polymerization step. Any type of chain terminating agent may be used as long as there is no substantial adverse effect on the novolak structure of the PHS formed.

It is also within the scope of the present invention to employ two or more carbinols in the reaction mixture or to use one or more carbinols in subsequent polymerizations after the initial polymerization; i.e. sequential polymerization with a different carbinol at each polymerization stage.

It is also within the scope of the present invention to utilize a non-novolak type polyhydroxystyrene homopolymer to add to the "carbinol/carboxylic acid" reaction mixture and then subject the overall reaction mixture to alkylation/polymerization to prepare a partial novolak type structure of polyhydroxystyrene.

In addition to the use of PHS (with a novolak-type structure) in the microelectronic chemicals market, such PHS can be employed in standard novolak applications such as varnishes, aniline printing inks, raw materials for epoxy resins, copying paper, tackifiers for rubber, and crude oil separators.

The following specific examples are supplied for the purpose of better illustrating the invention. These examples are not intended, however, to limit or restrict the scope of the invention in any way and should not be construed as providing conditions, parameters, or values which must be utilized exclusively in order to practice the present invention.

EXAMPLES 1–11

The following procedure was used in all 11 examples to prepare PHS. This procedure illustrates Example 4.

A three-neck three-liter flask was fired with a condenser, thermowell, nitrogen purge, and mechanical stirrer. To the flask was added 4-hydroxyphenylmethylcarbinol (HPMC) (352.0 g, 2.55 mol) and glacial acetic acid (1051.9 g, 17.52 mol). Not all of the HPMC was dissolved. The suspension was cooled to 9° C. using an ice bath and sulfuric acid (1.0 g) was added. The ice bath was removed and the suspension was allowed to warm, and at 19° C., all of the HPMC dissolved. The mixture exothermed, reaching a maximum temperature of 35° C. The reaction was stirred overnight at room temperature. The solution was poured into water (3×3000 mL), and the solid was isolated by filtration. The solid was washed with water (3×1000 mL), vacuum dried (50° C., 60 torr, 2 days), and weighed (288.7 g, 94.3%).

The solid obtained is a bright white powder which is soluble in acetone, methanol, tetrahydrofuran, and aqueous base and is insoluble in non-polar organics. The weight average molecular weight is 5600 and the number average molecular weight is 3675, giving a polydispersity of 1.53. The thermal stability by TGA showed no decomposition below 200° C. and the glass transition temperature is 143° C. The experimental conditions and results are shown in Tables 1, 2, 3, and 4.

EXAMPLE 12 (COMPARATIVE)

The procedure set forth in Examples 1–11 above were utilized except in Example 12, methanol was used instead of acetic acid. Example 12 yielded the benzyl ether (4-hydroxyphenylmethylcarbinol methyl ether) which did not form the PHS (with a novolak-like structure) upon polymerization. Thus, organic alcohols are not suitable replacements for carboxylic acids in order to form a novolak type structure.

DISCUSSION

In view of the experimental results, it would appear that the use of a carboxylic acid (e.g. acetic acid), with the carbinol, forms, e.g. an acetate, as determined by $^1$H NMR and by TLC analysis of the reaction mixture prior to polymerization. The subsequent addition of the catalyst (e.g. $H_2SO_4$) promotes the formation of polyalkylated homopolymers of 4-HPMC. This overall reaction is shown in Scheme 1 as follows:

SCHEME 1

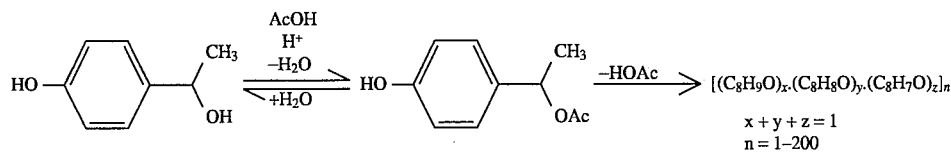

It was also found that 2-hydroxyphenylmethylcarbinol, 3-methyl-4-hydroxyphenylmethylcarbinol, 4-acetoxyphenylmethylcarbinol, 3-methyl-4-acetoxyphenylmethylcarbinol, and 4-hydroxybenzylalcohol all reacted under similar conditions to give polyalkylated polymers. In addition, it was found that poly(4-hydroxystyrene)alkylated under these conditions with 4-HPMC, Table 1.

The polymerizations are shown in Tables 1, 2, 3, and 4. In all cases, the conversions were high, with no detectable remaining monomers by TLC or GPC. The GPC analysis of these polymers are given in Table 2. The weight average molecular weight of a series of 4-HPMC polymers ranged from 5,300 to 7,000. Most of the polydispersities were lower than 2.00. Thermal analysis showed, for the 5,000 to 6,000 molecular weight polymers of 4-HPMC, a glass transition temperature of 143° C. with no weight loss below 200° C. The alkylation products of Example 4, using 4-HPMC, are shown in Tables 3 and 4. A comparison of the chemical shifts seen in the $^{13}$C NMR as compared to the monomer and a series of model compounds, shows three expected structures of the para, ortho-para, and ortho-ortho-para substituted structures (Table 3). For Example 4, these structures are in an approximate ratio of 1:1:1; however, the x+y+z (Scheme 1) equals 1, but the individual structures are not limited to 1:1:1 (or ⅓-⅓-⅓), thus there is no limitation on the structural ratio.

It is to be understood that the remarks above contain some theory as to the formation of PHS with a novolak type structure; however, Applicant does not wish to be so limited.

TABLE 1

Conditions for the polymerization of substituted phenyl carbinols.

| Example | Reactant | Catalyst | Temp. (°C.) | Time (hrs.) | Yield (%) | Weight % Acid | Weight % Solids |
|---|---|---|---|---|---|---|---|
| 1 | 4-HPMC[1] | $H_2SO_4$ | 25 | 1 | 87 | 4.0 | 20 |
| 2 | 4-HPMC | $H_2SO_4$ | 25 | 1.5 | 85 | 4.0 | 20 |
| 3 | 4-HPMC | $H_2SO_4$ | 25 | 16 | 69 | 0.4 | 20 |
| 4 | 4-HPMC | $H_2SO_4$ | 25 | 16 | 95 | 0.3 | 25 |
| 5 | 4-HPMC | $H_2SO_4$ | 25 | 16 | 88 | 0.2 | 25 |
| 6 | 4-HPMC | $AlCl_3$ | 55 | 16 | 91 | 0.6 | 21 |
| 7 | 4-HPMC | HCl | 55 | 16 | 85 | 0.6 | 20 |
| 8 | MHPMC[2] | $H_2SO_4$ | 25 | 16 | 86 | 0.4 | 20 |
| 9 | APMC[3] | $H_2SO_4$ | 60 | 1 | — | — | — |
| 10 | 2-HPMC[4] | $H_2SO_4$ | 25 | 16 | 87 | 0.01 | 18 |
| 11 | HBA[5] | $H_2SO_4$ | 25 | 16 | — | 1 | 24 |

[1]4-HPMC is 4-hydroxyphenylmethyl carbinol.
[2]MHPMC is 3-methyl-4-hydroxyphenylmethyl carbinol.
[3]APMC is 4-acetoyxphenylmethyl carbinol.
[4]2-HPMC is 2-hydroxyphenylmethyl carbinol.
[5]HBA is 4-hydroxybenzyl alcohol.

TABLE 2

Polymerization of substituted phenyl carbinols in acetic acid.

| Example | Reactant | Catalyst | $M_w$ | $M_n$ | PD[1] | $T_g$ (°C.) |
|---|---|---|---|---|---|---|
| 1 | 4-HPMC[2] | $H_2SO_4$ | 5,604 | 3,460 | 1.62 | |
| 2 | 4-HPMC | $H_2SO_4$ | 6,600 | 3,466 | 1.90 | |
| 3 | 4-HPMC | $H_2SO_4$ | 6,300 | 3,172 | 1.98 | 143 |
| 4 | 4-HPMC | $H_2SO_4$ | 5,600 | 3,675 | 1.53 | 143 |
| 5 | 4-HPMC | $H_2SO_4$ | 6,900 | 4,564 | 1.52 | |
| 6 | 4-HPMC | $AlCl_3$ | 1,835 | 1,407 | 1.30 | |
| 7 | 4-HPMC | HCl | 2,821 | 2,097 | 1.35 | |
| 8 | MHPMC[3] | $H_2SO_4$ | 3,900 | 2,248 | 1.74 | |
| 9 | APMC[4] | $H_2SO_4$ | 2,686 | 1,875 | 1.43 | |
| 10 | 2-HPMC[5] | $H_2SO_4$ | 3,525 | 2,285 | 1.54 | |
| 11 | HBA[6] | $H_2SO_4$ | 45,700 | 3,242 | 14.09 | |

[1]PD is polydispersity ($M_w/M_n$). [2]4-HPMC is 4-hydroxyphenylmethyl carbinol.
[3]MHPMC is 3-methyl-4-hydroxyphenylmethyl carbinol. [4]APMC is 4-acetoyxphenylmethyl carbinol.
[5]2-HPMC is 2-hydroxyphenylmethyl carbinol. [6]HBA is 4-hydroxybenzyl alcohol.

TABLE 3

Structures obtained by the polymerization of substituted phenyl carbinols.

| Starting Compound | Structure | Conditions | Possible Alkylation Products | | |
|---|---|---|---|---|---|
| | | | Di | Tri | End Group |
| 4-hydroxyphenyl-methylcarbinol (HPMC) | [structure: $H_3C$–CH(OH)–C₆H₄–OH] | Solvent: Acetic acid Catalyst: $H_2SO_4$, HCl, $AlCl_3$ Temperature: 0–20°C. | [di-alkylation structure] | [tri-alkylation structure] | [end group structure] |
| 3-Methyl-4-hydroxy-phenylmethylcarbinol (MHPMC) | [structure: $H_3C$–CH(OH)–C₆H₃(CH₃)–OH] | Solvent: Acetic acid Catalyst: $H_2SO_4$ Temperature: 0–20° C. | [di-alkylation structure with $CH_3$] | | [end group structure with $CH_3$] |

TABLE 3-continued

Structures obtained by the polymerization of substituted phenyl carbinols.

| Starting Compound | Structure | Conditions | Possible Alkylation Products | | |
|---|---|---|---|---|---|
| | | | Di | Tri | End Group |
| 4-Acetoxyphenyl-hydroxy-phenylmethylcarbinol (APMC) | (structure) | Solvent: Acetic acid Catalyst: $H_2SO_4$ Temperature: 40–60° C. | (structure) | (structure) | (structure) |

TABLE 4

Structures obtained by the polymerization of substituted phenyl carbinols.

| Starting Compound | Structure | Conditions | Possible Alkylation Products | | |
|---|---|---|---|---|---|
| | | | Di | Tri | End Group |
| 3-Methyl-4-Acetoxy-phenylmethylcarbinol (MAPMC) | (structure) | Solvent: Acetic acid Catalyst: $H_2SO_4$ Temperature: 60–80° C. | (structure) | (structure) | (structure) |
| 4-Hydroxybenzyl-alcohol (HBA) | (structure) | Solvent: Acetic acid Catalyst: $H_2SO_4$ Temperature: 0–20° C. | (structure) | (structure) | (structure) |

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A process for preparing polyhydroxystyrene having a novolak type structure which comprises the steps of (a) reacting at least one substituted phenyl carbinol with a carboxylic acid for a sufficient period of time and under suitable conditions of temperature and pressure to form a reaction mixture, and (b) polymerizing said reaction mixture in the presence of a suitable catalyst for a sufficient period of time and under suitable conditions of temperature and pressure to form a novolak type polymer, with the proviso that at least molar equivalents of carboxylic acid are used in step (a) of the process.

2. The process as set forth in claim 1 wherein said carbinol has the formula:

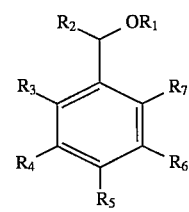

wherein $R_1$ is selected from the group consisting of H, alkyl $C_1$–$C_{20}$, substituted and unsubstituted phenyl, and $C(O)R_8$ (where $R_8$ is alkyl $C_1$–$C_{20}$); $R_2$ is selected from the group consisting of H and alkyl $C_1$–$C_{20}$; and $R_3$–$R_7$ are each independently selected from the group consisting of H; alkyl $C_1$–$C_{20}$, $OR_9$ (where $R_9$ is H, alkyl $C_1$–$C_{20}$, esters thereof, or substituted or unsubstituted phenyl), halogen, BZT, nitro and amino; with the proviso that at least one of $R_3$–$R_7$ is $OR_9$.

3. The process as set forth in claim 1 wherein said catalyst is a Lewis acid.

4. The process as set forth in claim 1 wherein the temperature in steps (a) and (b) is from about 0° C. to about 120° C.

5. The process as set forth in claim 1 wherein said catalyst is selected from the group consisting of $H_2SO_4$, HCl, $AlCl_3$, $H_3PO_4$, oxalic acid, $SnCl_2$, $BF_3$, $BBr_3$, $BCl_3$, para-toluene sulfonic acid, and methane sulfonic acid.

6. The process as set forth in claim 1 wherein said carboxylic acid is acetic acid.

7. The process as set forth in claim 1 wherein said catalyst is $H_2SO_4$.

8. The process as set forth in claim 1 wherein said carbinol is selected from the group consisting of 4-hydroxyphenylmethylcarbinol, 2-hydroxyphenylmethylcarbinol, and mixtures thereof.

9. The process as set forth in claim 1 wherein said carbinol is 3-methyl-4-hydroxyphenylmethylcarbinol.

10. The process as set forth in claim 1 wherein said carbinol is 4-acetoxyphenylmethylcarbinol.

11. The process as set forth in claim 1 wherein said carbinol is 3-methyl-4-acetoxyphenylmethylcarbinol.

12. The process as set forth in claim 1 wherein said carbinol is selected from the group consisting of 4-hydroxybenzyl alcohol, 2-hydroxybenzyl alcohol, and mixtures thereof.

13. A process for preparing a polyhydroxystyrene having a novolak type structure which comprises the step of polymerizing a mixture of carboxylic acid and at least one substituted phenyl carbinol whose formula is:

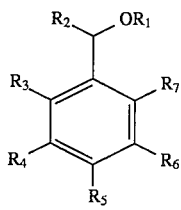

wherein (a) $R_1$ is selected from the group consisting of H, alkyl $C_1$–$C_{20}$, substituted and unsubstituted phenyl, and $C(O)R_8$ (where $R_8$ is alkyl $C_1$–$C_{20}$); (b) $R_2$ is selected from the group consisting of H and alkyl $C_1$–$C_{20}$; and (c) $R_3$–$R_7$ are each independently selected from the group consisting of H, alkyl $C_1$–$C_{20}$, $OR_9$ (where $R_9$ is H, alkyl $C_1$–$C_{20}$, esters thereof, or substituted or unsubstituted phenyl), halogen, BZT, nitro, or amino, with the proviso that at least one of $R_3$–$R_7$ is $OR_9$, in the presence of a suitable catalyst for a sufficient period of time and under suitable conditions of temperature and pressure to form said polyhydroxystyrene, with the proviso that at least molar equivalents of carboxylic acid are used in the polymerization step of the carboxylic acid and the substituted phenyl carbinol.

14. The process as set forth in claim 13 wherein (a) said catalyst is $H_2SO_4$; (b) the temperature is from about 0° C. to about 120° C.; (c) the carboxylic acid is acetic acid; (d) the carbinol is a hydroxyphenylcarbinol; and (e) the novolak polymer has a polydispersity of from about 1.0 to about 2.0 and a molecular weight of from about 1000 to about 30,000.

15. The process as set forth in claim 1 wherein there are at least two carbinols in said reaction mixture in step (a).

16. The process as set forth in claim 1 wherein there are at least two carbinols used and said second and any other carbinols are individually added after the previous polymerization step in order to form a novolak type block polymer.

17. The process as set forth in claim 1 wherein there is further included step (c) of reacting said novolak type polymer with a chain terminating agent.

18. The process as set forth in claim 1 wherein there is further included in step (a) a nucleating agent.

19. The process of claim 1 wherein in step (a), a polyhydroxystyrene having a non-novolak type structure is added to the reaction mixture.

* * * * *